United States Patent
Huber et al.

[11] Patent Number: 6,088,901
[45] Date of Patent: Jul. 18, 2000

[54] METHOD FOR PRODUCING A CARRIER ELEMENT FOR SEMICONDUCTOR CHIPS

[75] Inventors: Michael Huber, Nittendorf/Undorf; Peter Stampka, Schwandorf-Klardorf; Detlef Houdeau, Langquaid; Jürgen Fischer, Deuerliing; Josef Heitzer, Bach; Helmut Graf, Regensburg, all of Germany

[73] Assignee: Siemens Aktiengesellschaft, Munich, Germany

[21] Appl. No.: 09/211,107

[22] Filed: Dec. 14, 1998

Related U.S. Application Data

[63] Continuation of application No. PCT/DE97/01170, Jun. 10, 1997.

[51] Int. Cl.⁷ .................................................. B21D 35/00
[52] U.S. Cl. ........................ 29/469.5; 174/52.4; 361/737; 257/679; 156/252; 156/219
[58] Field of Search ........................... 29/469.5; 361/728, 361/736, 737, 749; 257/679; 156/252, 219, 242, 293; 428/901

[56] References Cited

U.S. PATENT DOCUMENTS

| | | | |
|---|---|---|---|
| 3,537,175 | 11/1970 | Clair et al. | 29/624 |
| 3,838,984 | 10/1974 | Crane et al. | 174/52.2 |
| 4,216,577 | 8/1980 | Badet et al. | 29/831 |
| 4,234,666 | 11/1980 | Gursky | 174/52.2 |
| 4,691,225 | 9/1987 | Murakami et al. | 174/52 FP |
| 4,701,236 | 10/1987 | Vieilledent | 156/252 |
| 4,746,392 | 5/1988 | Hoppe | 156/293 |
| 5,147,982 | 9/1992 | Steffen . | |
| 5,295,296 | 3/1994 | Hagiwara et al. | 29/827 |
| 5,376,588 | 12/1994 | Pendse | 437/211 |
| 5,850,690 | 12/1998 | Launay et al. | 174/52.2 |

FOREIGN PATENT DOCUMENTS

| | | |
|---|---|---|
| 0 484 353 B1 | 5/1992 | European Pat. Off. . |
| 2 644 630 | 9/1990 | France . |

*Primary Examiner*—David P. Bryant
*Assistant Examiner*—Jermie E. Cozart
*Attorney, Agent, or Firm*—Herbert L. Lerner; Laurence A. Greenberg; Werner H. Stemer

[57] ABSTRACT

A carrier element for a semiconductor chip, in particular to be built into smart cards. The carrier element has a substrate that carries the chip and a stiffening sheet which also carries the chip and has a recess for receiving the chip and its connection leads therein. An edge of the recess is provided with a frame formed integrally from the sheet.

9 Claims, 4 Drawing Sheets

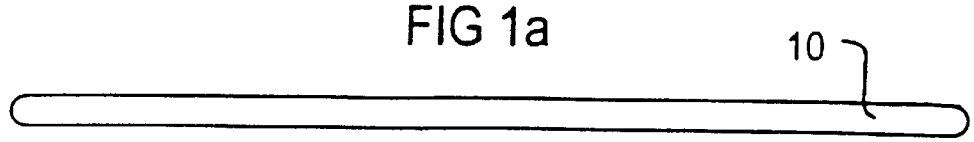
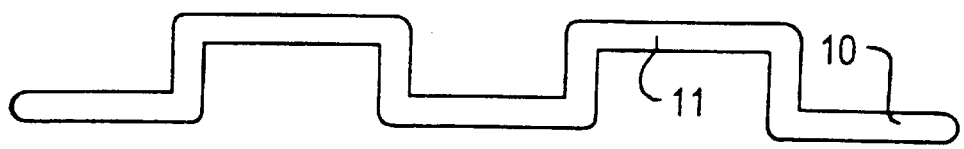
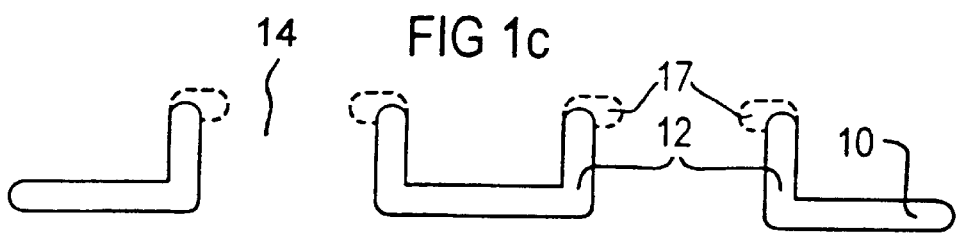
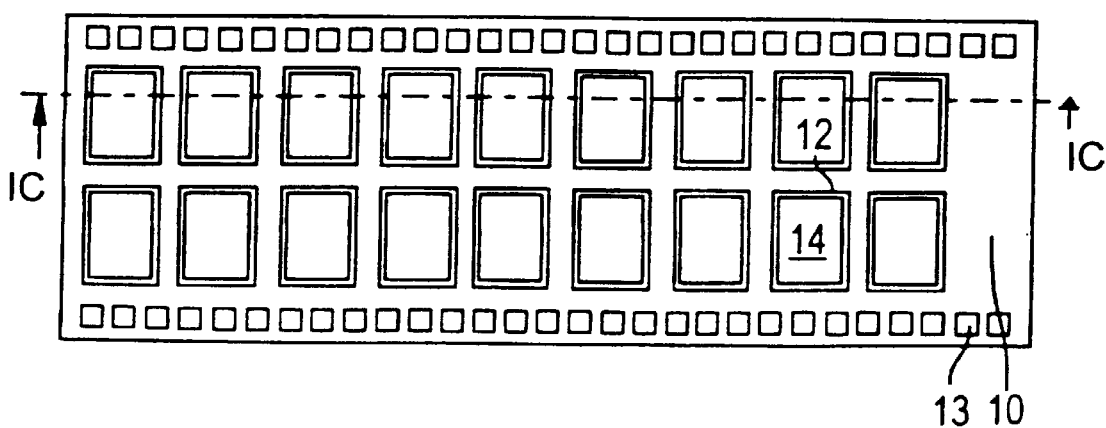

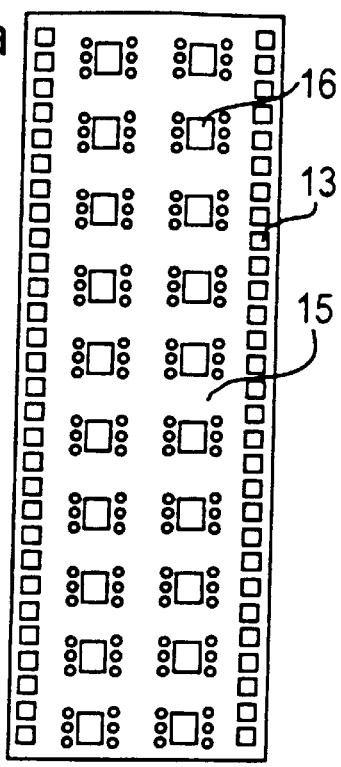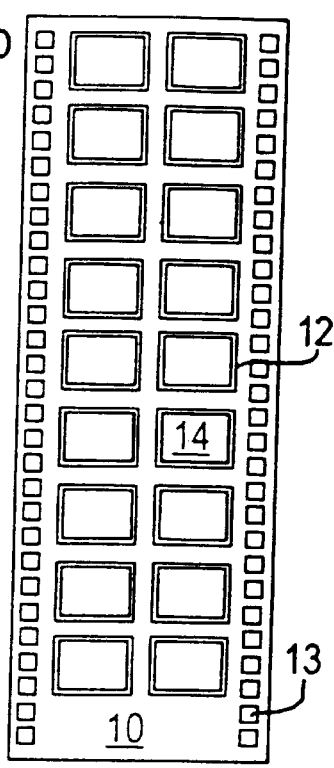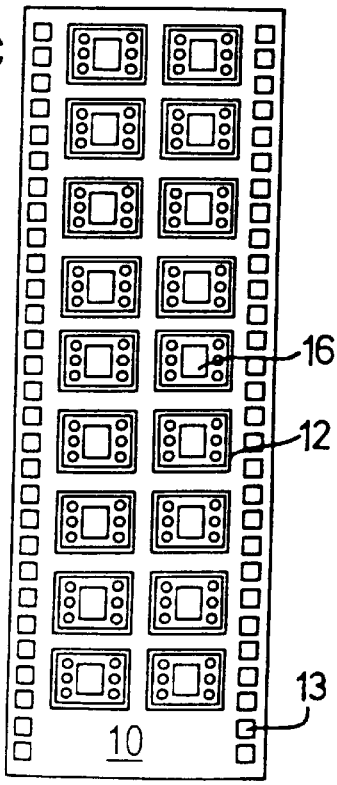

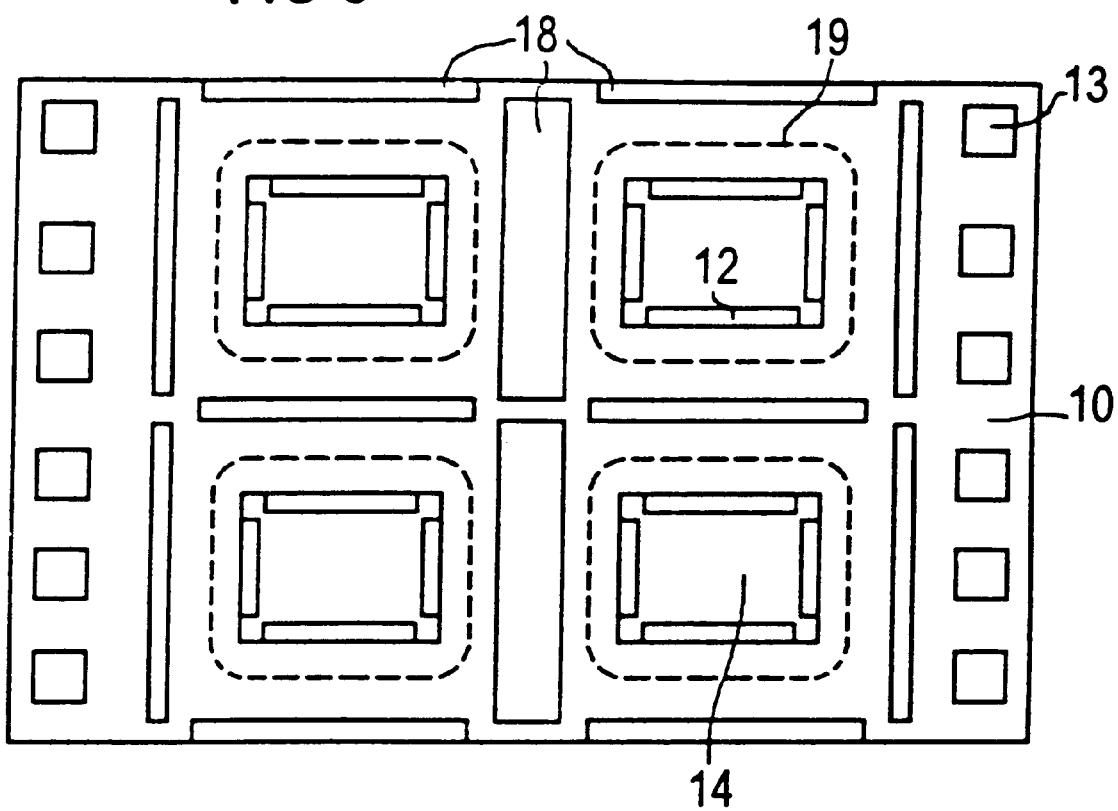

METHOD FOR PRODUCING A CARRIER ELEMENT FOR SEMICONDUCTOR CHIPS

CROSS-REFERENCE TO RELATED APPLICATION

This application is a continuation of copending International Application No. PCT/DE97/01170, filed on Jun. 10, 1997, which designated the United States.

BACKGROUND OF THE INVENTION

FIELD OF THE INVENTION

With contemporary smart cards, the semiconductor chip is fitted, by a carrier element usually formed with a non-conducting flexible substrate, into the smart card that is usually made of plastic. Not only the semiconductor chip, but also the contact faces, by which a reader can connect to the semiconductor chip, are disposed on the carrier element. To this, a surface-finished copper foil is usually laminated onto the non-conducting substrate and, for example, structured by etching. Before the lamination, holes are stamped into the non-conducting substrate, through which the chip can be electrically connected to the contact faces, for example using wires in the wire bond technique. The semiconductor chip and the wires are then covered by a protective encapsulation compound.

The smart cards need to be able to withstand particular bending loads, specified by the user. The bending forces which occur in this case must, however, be kept away from the chip since it is substantially more brittle than the material of the card. This is relevant, in particular, for chips that are larger than about 10 mm$^2$. From European Patent EP 0 484 353 B1 it is known to provide a stiffening frame on the flexible substrate, which frame has a substantially greater bending stiffness than the flexible carrier substrate.

FIG. 4 shows an embodiment according to European Patent EP 0 484 353 B1. The non-conducting, flexible carrier substrate is provided with recesses. A foil is laminated onto the substrate by an adhesive. The foil is structured into contact faces, electrically insulated from one another by grooves. A semiconductor chip is adhesively bonded onto the substrate and is electrically connected to the contact faces by wires. In order to stiffen the flexible substrate, a stiffening ring is adhesively bonded onto the substrate. The interior of the stiffening ring is filled with an encapsulation compound, in order to protect the chip and the wires.

It is difficult to fit the stiffening ring, since there are relatively large positional tolerances and, in addition, the fitting operation requires special, elaborate tools. The overall result is very difficult and requires elaborate process control. Furthermore, the area needed for adhesively bonding the carrier element onto the card is restricted by the known stiffening ring.

U.S. Pat. No. 5,147,982 presents a carrier element in which a plastic sheet, which has an integrally formed strengthening and protective frame, is laminated onto a stamped metal grid that forms contact faces.

SUMMARY OF THE INVENTION

It is accordingly an object of the invention to provide a method for producing a carrier element for semiconductor chips which overcomes the above-mentioned disadvantages of the prior art methods of this general type, in which a simple method for producing a carrier element is provided.

With the foregoing and other objects in view there is provided, in accordance with the invention, a method for producing a carrier element for a semiconductor chip, which includes: forming a trough in a stiffening sheet by deep-drawing; stamping a bottom of the trough for defining a frame with a recess formed therein for receiving a chip and associated connection leads; and laminating the stiffening sheet onto a chip receiving side of a flexible substrate.

The method according to the invention has the advantage that the same, or similar, process steps are carried out as with the production of the carrier substrate or the known carrier element. These are stamping and lamination process steps. Since the stiffening sheet has the same external dimensions as the carrier element, the same machines can be used for lamination of the copper sheet that forms the contact faces. The carrier elements are normally manufactured in a very long tape, it even being possible for a plurality of carrier elements to lie next to one another. At its edges, the tape has perforations, by which it can be fed forward in the manufacturing machine. If the stiffening sheet also has these holes, it can be fed and processed in similar fashion to the flexible carrier substrate or the contact-face sheet. The deep-drawing of the cavity produces relatively large stresses, which are at least partly released by mechanical loading when the reel, onto which the tape is wound, is wound, unwound and rewound, it thus being possible for material to be damaged in the upper, exposed region of the frame. In a refinement of the invention, stress-relief holes, which may be configured as slits, are provided in the tape, close to those carrier element regions produced later by stamping. In order to avoid notching effects, which can lead to microcracks at the edge of the stress-relief holes, the corners of the edges are advantageously rounded. After punching out from the tape, the stress-relief holes are no longer visible on the carrier element, so that the appearance of the contact faces is not thereby impaired. By deep-drawing without corners in the frame, the elasticity of the tape as a whole may, in addition, be increased further.

Since the frame produced by deep-drawing and stamping along the edge of the recess in the stiffening sheet only has the same thickness as the copper foil itself, enough space is left in the region outside the frame itself for an adhesive, in order to make it possible to fasten the carrier element in a card. The thickness of the stiffening sheet can be chosen as a function of the desired overall bending stiffness and the material properties of the sheet employed.

It is particularly advantageous if, instead of stamping the entire bottom of the trough, a web is left at the edge of the frame, which additionally increases the banding stiffness.

In accordance with an added feature of the invention, there are the steps of forming the flexible substrate as a non-conducting sheet; and laminating a conductive sheet structured into contact faces on the flexible substrate on a side opposite from the chip receiving side.

In accordance with another feature of the invention, there is the step of forming the flexible substrate as a foil.

In accordance with an addition feature of the invention, there is the step of forming the stiffening sheet from metal.

In accordance with a further added feature of the invention, there is the step of forming the stiffening sheet from plastic.

In accordance with a concomitant feature of the invention, there are the steps of forming the flexible substrate as a non-conducting sheet; and laminating a conductive sheet, structured into side contact faces, onto the flexible substrate on a side opposite from the stiffening sheet.

Other features which are considered as characteristic for the invention are set forth in the appended claims.

Although the invention is illustrated and described herein as embodied in a method for producing a carrier element for semiconductor chips, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIGS. 1a–1c are cross-sectional views of process steps for producing a stiffening sheet according to the invention;

FIG. 1d is a plan view of a finished sheet;

FIGS. 2a–2c are plan views of a flexible carrier substrate, the stiffening sheet and how these two parts are connected;

FIG. 5 is a plan view of the stiffening sheet with stress-relief holes.

DESCRIPTION OF THE PREFERRED EMBODIMENTS

Figure 3:
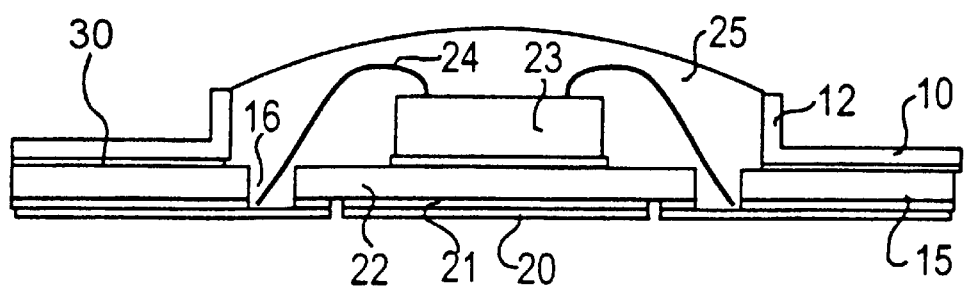
FIG. 3 is a cross-sectional view through a carrier element.

In all the figures of the drawing, sub-features and integral parts that correspond to one another bear the same reference symbol in each case. Referring now to the figures of the drawing in detail and first, particularly, to FIG. 4 thereof, there is shown a prior art embodiment of a carrier element. The carrier element has a non-conducting, flexible carrier substrate 1 provided with recesses 2. A foil 3 is laminated onto the carrier substrate 1 by an adhesive 4. The foil 3 is structured into contact faces, electrically insulated from one another by grooves 5. A semiconductor chip 6 is adhesively bonded onto the carrier substrate 1 and is electrically connected to the contact faces 3 by wires 7. In order to stiffen the flexible substrate 1, a stiffening ring 8 is adhesively bonded onto the substrate 1. The interior of the stiffening ring 8 is filled with an encapsulation compound 9, in order to protect the chip 6 and the wires 7.

In FIG. 1a there is shown a cross-sectional view through a stiffening foil or sheet 10 rolled to a corresponding thickness according to the invention of the instant application. FIG. 1b shows troughs 11 produced in the stiffening sheet 10 by a deep-drawing process. In a stamping process, bottoms of the troughs 11 are removed, so that only the walls of the troughs 11 are left, as frames 12 which are integrally connected to the stiffening sheet 10 and extend along the edge of the sheet recess 14 defined by the former troughs 11. Advantageously, not all of the bottoms of the troughs 11 are stamped, so that a web 17 (represented by dashes) is left, which provides an additional increase in the bending stiffness.

FIG. 1d is a plan view of the stiffening sheet 10 according to the invention, which is constructed as a long tape. Perforations 13 are made along both edges of the tape, and allow the tape to be fed forwards by sprocket wheels. The sheet 10 has the recesses 14, along whose edges the frames 12 extend. The section that forms the cross-sectional view in FIG. 1c is represented by the dashed line Ic—Ic.

The stiffening sheet 10 according to the invention is shown again in FIG. 2b. FIG. 2a shows a flexible carrier substrate 15, which may be made of a plastic, in which case, currently, epoxy resin reinforced by glass fibers is conventionally used. The flexible carrier substrate 15 is also constructed as a long tape and has the perforations 13 at its edges for forward feeding and accurate positioning during subsequent processing. The flexible carrier substrate 15 has punched recesses 16, into which a non-illustrated semiconductor chip can be fitted and through which the semiconductor chip can be electrically connected to contact faces (not visible) on the rear of the carrier substrate 15. Lastly, FIG. 2c represents the stiffening sheet 10 connected to the carrier substrate 15. The stamped recesses 16 of the carrier substrate 15 lie within the frame 12 that is integrally connected to the stiffening sheet 10, so that the non-illustrated semiconductor chip can be fitted without problems into the central recess 14, 16 and can be connected, through the recesses 16 in the carrier substrate 15, to the contact faces (not visible) provided on the rear of the flexible carrier substrate 15.

FIG. 3 shows a cross-sectional view through a carrier element stamped from the tape. The non-conducting flexible carrier substrate 15 has, in this case, only the recesses 16 produced is by stamping. A foil or sheet 20, which is structured into contact faces by grooves 22, is laminated on the rear of the carrier substrate by an adhesive 21. A semiconductor chip 23, which is connected to the contact faces 20, through the recesses 16 of the carrier substrate 15, by bonding wires 24, is disposed on the carrier substrate 15. On the front of the carrier substrate 15, carrying the semiconductor chip 23, according to the invention the stiffening sheet 20 is laminated by an adhesive 30. The region within the frame 12, formed integrally in the stiffening sheet 10, is filled with an encapsulation compound 25 for protecting the semiconductor chip 23 and the bonding wires 24.

Figure 4:
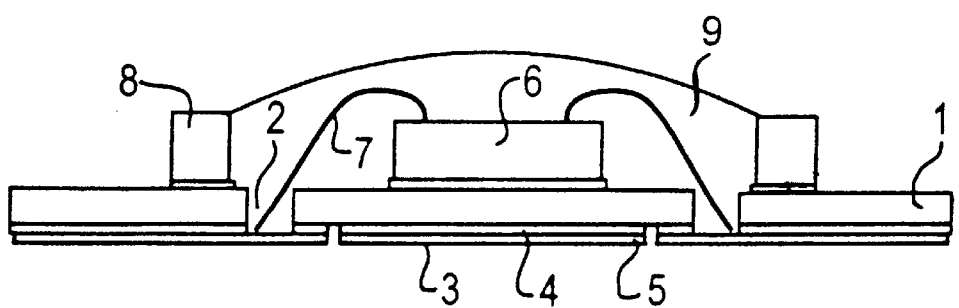
FIG. 4 is a cross-sectional view through the carrier element according to the prior art.

As can be seen in comparison with FIG. 4, a larger area is left on the carrier element according to the invention in the region of the edge of the carrier element, in order to allow it to be adhesively bonded better into a plastic card.

FIG. 5 shows stress-relief holes 18, according to the invention, in the stiffening sheet 10, which lie outside the regions 19 (indicated by dashes) of carrier elements produced subsequently by stamping.

FIGS. 3 and 4 show a non-conducting flexible carrier substrate 15, or 1, respectively, which has a metal covering 20 or 3, respectively, that forms the contact faces. In principle, however, it is also possible to use a conductive, for example metallic, carrier substrate.

Furthermore, it is also conceivable to choose plastic for the material of the stiffening sheet 10. This being the case, other production processes than deep-drawing and stamping would also be conceivable.

We claim:

1. A method for producing a carrier element for a semiconductor chip, which comprises:

forming a trough in a stiffening sheet by deep-drawing;

stamping a bottom of the trough for defining a frame with a recess formed therein for receiving a chip and associated connection leads; and laminating the stiffening sheet onto a chip receiving side of a flexible substrate.

2. The method according to claim 1, which comprises:

forming the flexible substrate as a non-conducting sheet; and laminating a conductive sheet structured into contact faces on the flexible substrate on a side opposite from the chip receiving side.

3. The method according to claim 1, which comprises forming the flexible substrate as a foil.

4. The method according to claim 1, which comprises forming the stiffening sheet from metal.

5. The method according to claim 1, which comprises forming the stiffening sheet from plastic.

6. The method according to claim 1, which comprises:

forming the flexible substrate as a non-conducting sheet; and laminating a conductive sheet, structured into side contact faces, onto the flexible substrate on a side opposite from the stiffening sheet.

7. The method according to claim 1, which comprises forming stress-relief holes in the stiffening sheet outside a carrier-element region.

8. A method for producing a carrier element for a semiconductor chip, which comprises:

forming a trough in a stiffening sheet by deep-drawing;

stamping a part of a bottom of the trough for defining a frame having an end with an integral web extending from the end, substantially perpendicular to the frame and a recess formed therein for receiving a chip and associated connection leads; and laminating the stiffening sheet onto a chip receiving side of a flexible substrate.

9. A method for producing a carrier element for a semiconductor chip and to be built into a smart card, which comprises:

forming a trough in a stiffening sheet by deep-drawing;

stamping a bottom of the trough for defining a frame with a recess formed therein for receiving a chip and associated connection leads; and laminating the stiffening sheet onto a chip receiving side of a flexible substrate.

* * * * *